United States Patent [19]
Dalmia

[11] Patent Number: 6,075,416
[45] Date of Patent: Jun. 13, 2000

[54] METHOD, ARCHITECTURE AND CIRCUIT FOR HALF-RATE CLOCK AND/OR DATA RECOVERY

[75] Inventor: Kamal Dalmia, Austin, Tex.

[73] Assignee: Cypress Semiconductor Corp., San Jose, Calif.

[21] Appl. No.: 09/283,058

[22] Filed: Apr. 1, 1999

[51] Int. Cl.$^7$ ............................ H03L 7/087; H03L 7/095; H03L 7/099

[52] U.S. Cl. .............................. 331/25; 331/1 A; 331/11; 331/12; 331/14; 331/17; 331/DIG. 2; 375/376

[58] Field of Search ................................ 331/1 A, 10–12, 331/14, 16–18, 23, 25, 45, 57, DIG. 2; 327/156–159; 375/376

[56] References Cited

U.S. PATENT DOCUMENTS

| | | | |
|---|---|---|---|
| 5,138,281 | 8/1992 | Boudewijns | 331/1 A |
| 5,301,196 | 4/1994 | Ewen et al. | 370/105.2 |
| 5,384,551 | 1/1995 | Kennedy et al. | 331/17 |
| 5,436,938 | 7/1995 | Pigeon | 375/376 |
| 5,512,860 | 4/1996 | Huscroft et al. | 331/1 A |

OTHER PUBLICATIONS

A 0.8–$\mu$m CMOS 205 Gb/s Oversampling Receiver and Transmitter for Serial Links, By: Chih–Kong Ken Yang and Mark A. Horowitz, IEEE Journal of Solid–State Circuits, vol. 31, No. 12, Dec. 1996, pp. 2015–2023.

FP 15.3: A 1.25Gb/s, 460mW CMOS Transceiver for Serial Data Communication, By: Dao–Long Chen, Michael O. Baker, 1997 IEEE International Solid–State Circuits Conference, pp. 242–243.

FP 15.1: A 1.0625Gbps Transceiver with 2x–Oversampling and Transmit Signal Pre–Emphasis, By: Alan Fiedler, Ross Mactaggart, James Welch, Shoba Krishnan, 1997 IEEE International Solid–State Circuits Conference, pp. 238–239.

Mohammad Navabi et al., U.S. Ser. No. 08/878,714, Phase Locked Loop (PLL) With Linear Parallel Sampling Phase Detector, filed Jun. 19, 1997.

Mohammad Navabi et al., U.S. Ser. No. 08/879,287, Phase Detector With Linear Output Response, filed Jun. 19, 1997.

Kamal Dalmia, U.S. Ser. No. 09/302,214, Clock An Data Recovery PLL Based on Parallel Architecture, filed Apr. 29, 1999.

Kamal Dalmia, U.S. Ser. No. 09/302,213, Phase Detector With Extended Linear Range, filed Apr. 29, 1999.

Kamal Dalmia et al., U.S. Ser. No. 09/216,465, Phase Detector, filed Dec. 18, 1998.

*Primary Examiner*—David Mis
*Attorney, Agent, or Firm*—Christopher P. Maiorana, P.C.

[57] ABSTRACT

A circuit comprising an oscillator, a multiplexer, a half rate clock circuit and a full rate clock circuit. The oscillator may be configured to generate a first clock signal and a second clock signal in response to a control signal. The multiplexer may be configured to generate the control signal in response to (i) a half-rate clock signal and (ii) a full rate clock signal. The half rate clock circuit may be configured to generate the half rate clock signal in response to the first and second clock signals. The full rate clock circuit may be configured to generate the full rate clock in response to (i) one of the first and second clock signals and (ii) a reference clock.

16 Claims, 3 Drawing Sheets

METHOD, ARCHITECTURE AND CIRCUIT FOR HALF-RATE CLOCK AND/OR DATA RECOVERY

CROSS-REFERENCE TO RELATED APPLICATION(S)

The present invention may relate to co-pending application Ser. No. 09/216,465, filed Dec. 28, 1998 and to co-pending provisional Ser. No. 60/104,486, which are each hereby incorporated by reference in their entirety.

FIELD OF THE INVENTION

The present invention relates to clock circuits generally and, more particularly, to a linear clock and recovery phase-lock loop (PLL).

BACKGROUND OF THE INVENTION

Referring to FIG. 1, a conventional phase-lock loop (PLL) circuit 10 used for performing clock and data recovery in a serial data communication device is shown. A voltage controlled oscillator (VCO) 12 generates a full-rate clock which is divided by "N" (an integer) by a divider (FBDIV) 14. The divided clock is fed to a phase-frequency detector (PFD) 16. The PFD 16 receives a reference clock signal REFCLK_IN which is typically divided by N version of the data rate. The PFD 16 compares the two clocks and generates pump-up and pump-down signals which are then fed to a charge-pump/filter 18 through a multiplexer 20 that is controlled by a signal LLC. The signal LLC controls the "locking" of the PLL 10 to the signal REFCLK_IN or to the signal DATA. When the PLL 10 is frequency locked to the signal REFCLK, the multiplexer 20 is switched to select the signal DATA, through a phase detector (PD) 22 for the closed loop by using the signal LLC. The phase detector 22 then locks to the signal DATA and generates a signal re-timed DATA and recovered a signal CLOCK. This implementation requires the use of a full-rate phase detector 22 and a full-rate VCO 12. The VCO 12 generates a single phase of the clock. The divider 14 is also full-rate single-phase divider.

The circuit 10 may require full-rate components for the phase detector 22 and the VCO 12. Additionally, the phase detector 22 may have to be implemented as a linear full-rate phase detector. The full-rate operation may require higher power components.

SUMMARY OF THE INVENTION

The present invention concerns a circuit comprising an oscillator, a multiplexer, a half rate clock circuit and a full rate clock circuit. The oscillator may be configured to generate a first clock signal and a second clock signal in response to a control signal. The multiplexer may be configured to generate the control signal in response to (i) a half-rate clock signal and (ii) a full rate clock signal. The half rate clock circuit may be configured to generate the half rate clock signal in response to the first and second clock signals. The full rate clock circuit may be configured to generate the full rate clock in response to (i) one of the first and second clock signals and (ii) a reference clock.

The objects, features and advantages of the present invention include providing a phase-lock loop that may (i) enable higher data rate linear PLLs in existing integrated-circuit technologies, (ii) consume less power than conventional approaches, and/or (iii) provide improved jitter performance compared to conventional approaches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a linear clock and data recovery phase-lock loop (PLL) that may recover a half-rate clock signal from a serial input data stream. The present invention may then retime the data stream with the recovered half-rate clock to generate half and full rate recovered data.

Figure 2:
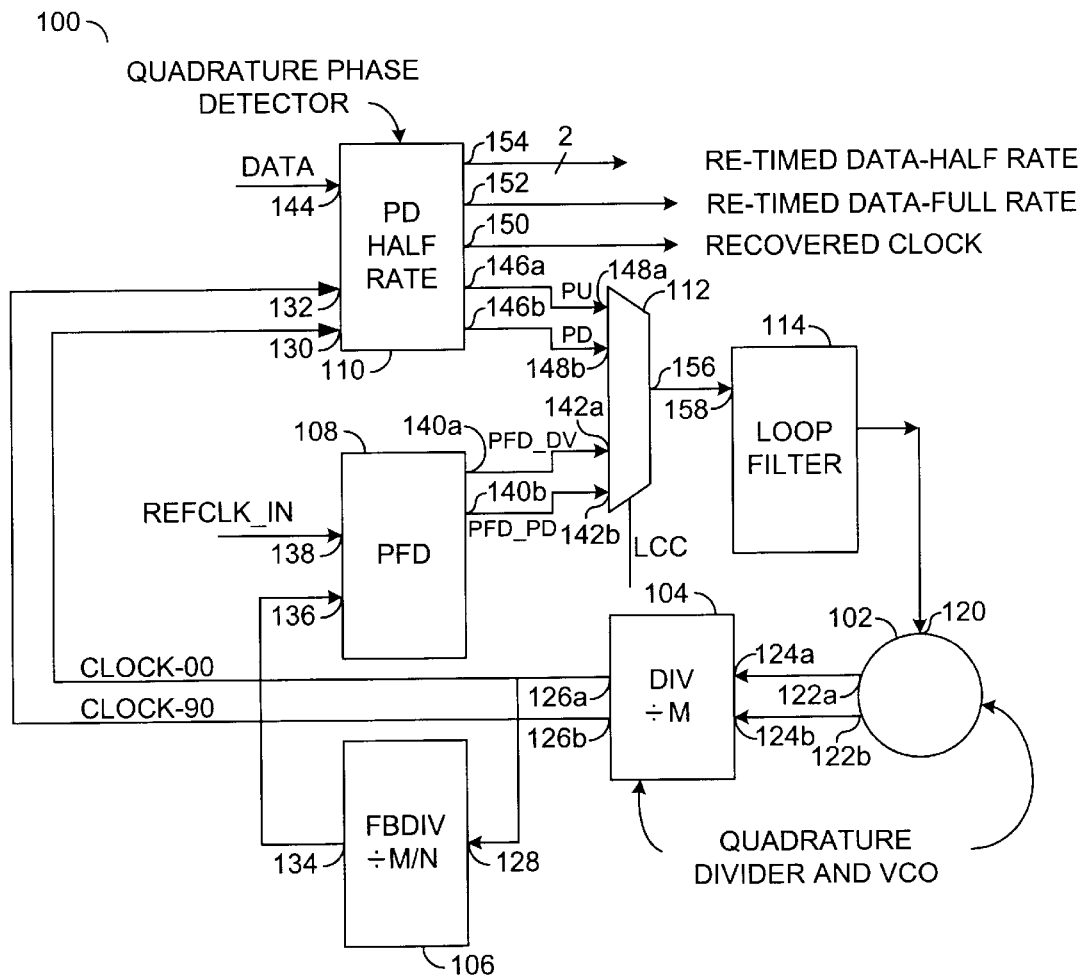
FIG. 2 is a block diagram of a preferred embodiment of the present invention.

Referring to FIG. 2, a block diagram of a circuit 100 is shown in accordance with a preferred embodiment of the present invention. The circuit 100 generally comprises a voltage controlled oscillator (VCO) 102, a divider 104, a divider 106, a phase frequency detector (PFD) 108, a phase detector 110, a multiplexer 112 and a loop filter 114. The VCO 102 generally comprises an input 120 and an output 122a and 122b. The output 122a and 122b generally present a signal to an input 124a and 124b of the divider 104. The divider 104 generally comprises an output 126a that may present a signal to an input 128 of the divider 106 as well as to an input 130 of the phase detector 110. The divider 104 may also comprise an output 126b that may present a signal to an input 132 of the phase detector 110.

The divider 106 generally comprises an output 134 that may present a signal to an input 136 of the PFD 108. The PFD 108 may also receive an input clock signal (e.g., REFCLK_IN) at an input 138. The PFD 108 generally comprises an output 140a and 140b that may present a first signal (e.g., PU) and a second signal (e.g., PD) to an input 142a and an input 142b, respectively, of the multiplexer 112. The phase detector 110 may also have an input 144 that may receive an input signal (e.g., DATA). The phase detector 110 generally comprises an output 146a and an output 146b that may present a first signal (e.g., PFD_PU) and a second signal (e.g., PFD_PD) to an input 148a and 148b, respectively, of the multiplexer 112, an output 150 that may present a recovered clock signal, an output 152 that may present a re-timed version of the signal DATA (that may be operating at a full rate clock), and an output 154 that may present a multi-bit signal that may be a re-timed version of the signal DATA (that may be operating at a half-rate clock). The multiplexer 112 generally comprises an output 156 that may present a signal to an input 158 of the block 114. The signals PU and PFD_PU may be pump-up signals. The signals PD and PFD_PD may be pump-down signals.

The phase detector 110 may be implemented, in one example, as a half-rate linear phase-detector. The VCO 102 may be implemented, in one example, as a half-rate VCO. The divider 104 may be implemented, in one example, as a quadrature divider. The divider 106 may be implemented, in one example, as a single-phase divider. The PFD 108, the multiplexer 112 and the loop filter 114 may be implemented using conventional approaches. The VCO 102 may generate two clocks at the outputs 122a and 122b, respectively, that are 90 degrees apart in phase (e.g., a quadrature differential signal). These two clocks may then be divided by the quadrature divider 104 to generate a first signal (e.g., CLOCK-00) and a second signal (e.g., CLOCK-90). The divider 106 may divide the signal CLOCK-00(or the signal CLOCK-90) by the ratio M/N (where M and N are integers), thus doing an effective division by N. The signal REFCLK_IN may be a divide-by-N version of the input data rate. Thus the close loop with the PFD 108 may be similar to the circuit 10. When the PLL 100 is frequency locked to the signal REFCLK_IN, the loop may be configured to recover data with the PD 110 in the loop by switching the multiplexer 112 in response to the signal LLC. In the data recovery mode, both phases of the VCO 102 may be used by the linear half-rate phase-detector 110. In an alternate example, the input 128 of the divider 106 may receive the same signal presented to the input 124a of the divide 104. In such an implementation, the divider 106 may be configured to provide a division by N directly.

Figure 3:
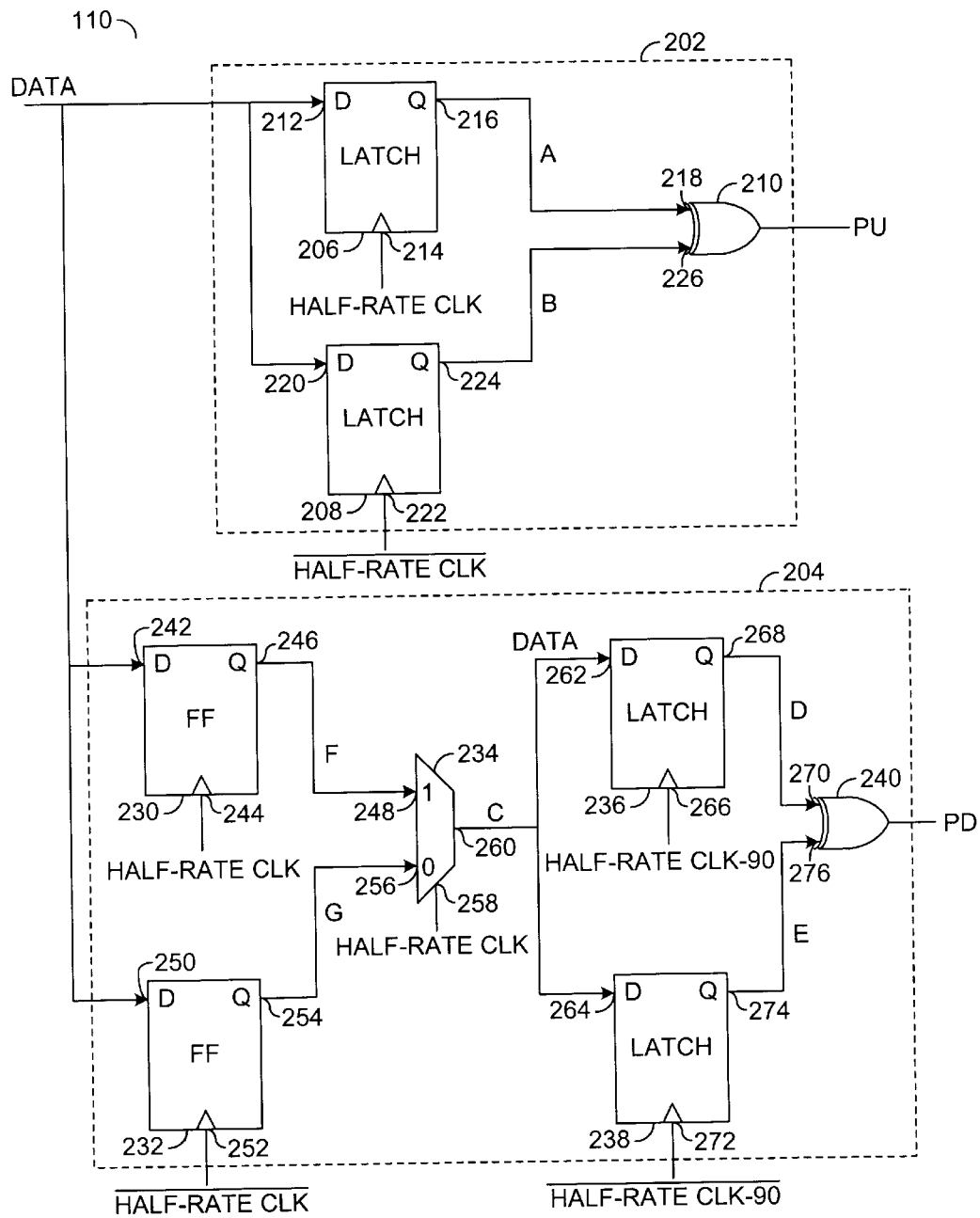
FIG. 3 is an example of the phase detector of FIG. 2.

An example of an implementation of the half-rate linear phase-detector 110 may be found in co-pending application Ser. No. 09/216,465, filed on Dec. 12, 1998, which is hereby incorporated by reference in its entirety. FIG. 3 illustrates such an implementation of the phase detector 110.

The phase detector 110 generally comprises a pump-up block (or circuit) 202 and a pump-down block (or circuit) 204. The pump-up block 202 may be configured to present a pump-up signal (e.g., PU) in response to (i) an input data signal (e.g., DATA) and (ii) a half-rate clock (e.g., half-rate CLK). The pump-down block 204 may be configured to present a pump-down signal (e.g., PD) in response to (i) the input data signal DATA, (ii) the signal half-rate CLK and (iii) a quadrature of the signal half-rate CLK (e.g., half-rate CLK-90).

The pump-up circuit 202 generally comprises a latch 206, a latch 208 and a gate 210. The latch 206 generally includes an input 212 that may receive the input data signal DATA, an input 214 that may receive the signal half-rate CLK and an output 216 that may present a signal (e.g., A) to an input 218 of the gate 210. The latch 208 may have an input 220 that may receive the input data signal DATA, an input 222 that may receive a complement of the signal half-rate CLK (i.e., half-rate CLKB) and an output 224 that may present a signal (e.g., B) to an input 226 of the gate 210. The gate 210 may present the pump-up signal PU in response to the signal A and the signal B.

The pump-down block 204 generally comprises a flip-flop 230, a flip-flop 232, a multiplexer 234, a latch 236, a latch 238, and a gate 240. The flip-flop 230 may have an input 242 that may receive the signal DATA, an input 244 that may receive the signal half-rate CLK and an output 246 that may present a signal (e.g., F) to an input 248 of the multiplexer 234. The flip-flop 232 may have an input 250 that may receive the signal DATA, an input 252 that may receive the signal half-rate CLKB and an output 254 that may present a signal (e.g., G) to an input 256 of the multiplexer 234. The multiplexer 234 may also have an input 258 that may receive the signal half-rate CLK. The multiplexer 234 may also have an output 260 (e.g., the retimed data signal) that may present a signal (e.g., C) to an input 262 of the latch 236 as well as to an input 264 of the latch 238. The latch 236 may also have an input 266 that may receive a signal half-rate CLK-90 (e.g., a quadrature of the signal half-rate CLK) and an output 268 that may present a signal (e.g., D) to an input 270 of the gate 240. The latch 238 may also have an input 272 that may receive the signal half-rate CLK-90B (which may be a digital complement of the signal half-rate CLK-90) and an output 274 that may present a signal (e.g., E) to an input 276 of the gate 240. The gate 240 may present the pull-down signal PD in response to the signal D and the signal E. The gate 210 may be implemented, in one example, as an XOR gate. However, other gates may be implemented to accommodate various polarities of the signal A and B.

As shown in FIG. 3, the pump-up signal PU may be generated in response to the latch 206, the latch 208 and the XOR gate 210. The latch 206 generally latches the signal DATA during the "high" cycles of the signal half-rate CLK (to be described in more detail in connection with FIG. 4). The latch 208 may latch the signal DATA during the "low" cycles of the signal half-rate CLK. The latched data (i.e., the signals A and B) may be fed into the XOR gate 210 which, in turn, may generate the pump-up signal PU.

The pump-down signal PD may be generated by shifting the data by a half-bit. The half-bit shift may be done by using the flip-flops 230 and 232 to clock the signal DATA and the multiplexer 234 to recombine the shifted data into the signal C. The recombined data may then be presented to the latches 236 and 238. The latch 236 may latch the shifted data during the high cycles of the signal half-rate CLK-90. The latch 238 may latch the shifted data during the low cycle of the signal half-rate CLK-90.

Figure 1:
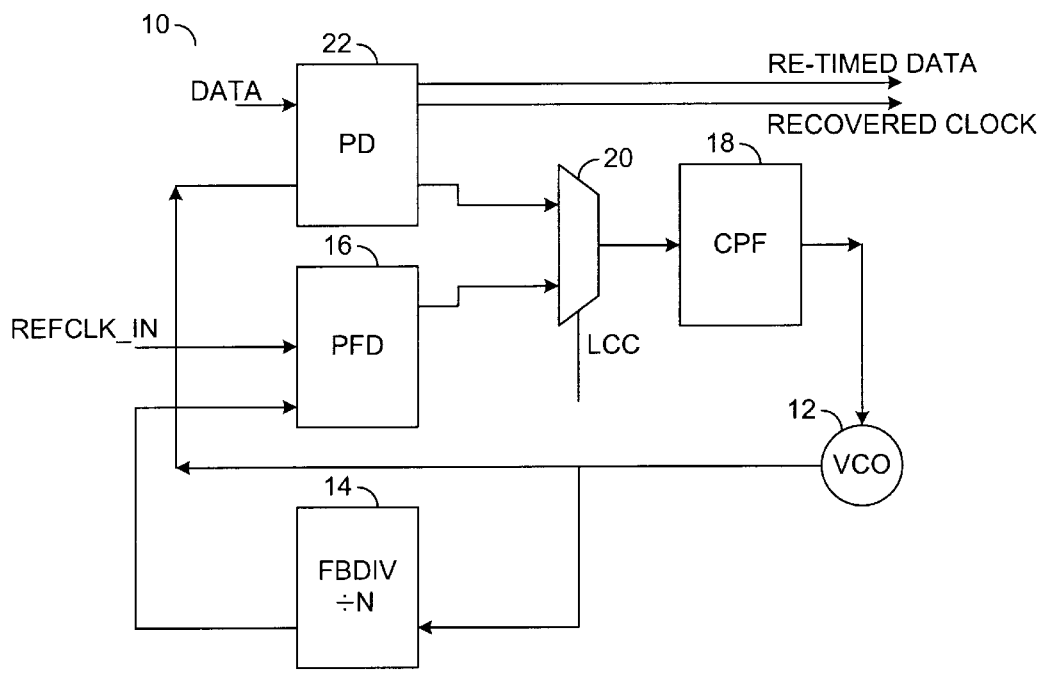
FIG. 1 is a diagram of a conventional clock and recovery circuit.
Figure 4:
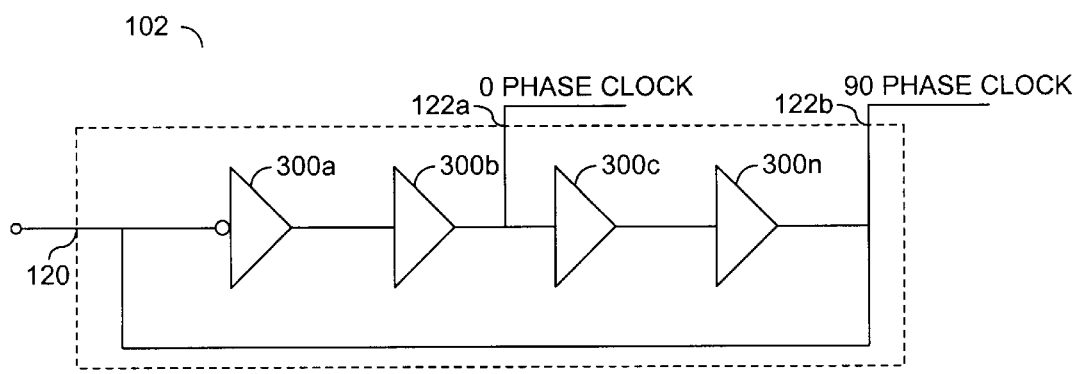
FIG. 4 is an example of the VCO of FIG. 2.

The VCO 102 may be implemented by generating half-rate quadrature clocks as shown in FIG. 4. The VCO 102 shown in FIG. 4 is a classic ring-oscillator VCO. The VCO 102 generally comprises a number of oscillator elements 300a–300n. The 0 and 90 degree phases of the clock (e.g., the signals presented at the outputs 122a and 122b) may be obtained from a VCO as shown.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   an oscillator configured to generate a first clock signal and a second clock signal in response to a control signal;
   a multiplexer configured to generate said control signal in response to (i) a half-rate clock signal and (ii) a full rate clock signal;
   a half rate clock circuit configured to generate said half rate clock signal in response to said first and second clock signals; and
   a full rate clock circuit configured to generate said full rate clock in response to (i) one of said first and second clock signals and (ii) a reference clock.

2. The circuit according to claim 1, wherein said circuit generates a one or more half-rate data recovery signals.

3. The circuit according to claim 1, wherein said oscillator comprises a voltage controlled oscillator (VCO).

4. The circuit according to claim 1, further comprising:
   a first divider circuit configured to divide the frequency of said first and second clock signals.

5. The circuit according to claim 4, further comprising:
   a second divider circuit configured to divide said one of said first and second clock signals presented to said full rate clock circuit.

6. The circuit according to claim 1, wherein said half rate clock circuit comprises a phase detector.

7. The circuit according to claim 1, wherein said full rate clock circuit comprises a phase frequency detector circuit.

8. The circuit according to claim 1, wherein said half rate clock circuit is configured to generate said half rate clock signal in further response to a data input signal.

9. The circuit according to claim 8, wherein said half rate clock circuit is configured to generate:
   a first data output signal operating at said half rate clock;
   a second data output signal operating at said full rate clock; and
   a recovered clock signal.

10. The circuit according to claim 1, further comprising a loop filter circuit configured between said control signal and said oscillator.

11. A circuit comprising:
   means for generating a first clock signal and a second clock signal in response to a control signal;
   means for generating said control signal in response to (i) a half-rate clock signal and (ii) a full rate clock signal;
   means for generating said half rate clock signal in response to said first and second clock signals; and
   means for generating said full rate clock in response to (i) one of said first and second clock signals and (ii) a reference clock.

12. A method for data recovery comprising the steps of:
   (A) generating a first clock signal and a second clock signal in response to a control signal;
   (B) generating said control signal in response to (i) a half-rate clock signal and (ii) a full rate clock signal;
   (C) generating said half rate clock signal in response to said first and second clock signals; and
   (D) generating said full rate clock in response to (i) one of said first and second clock signals and (ii) a reference clock.

13. The method according to claim 12, further comprising the step of:
   dividing the frequency of said first and second clock signals.

14. The method according to claim 12, further comprising the step of:
   dividing said one of said first and second clock signals.

15. The method according to claim 12, wherein step (C) is configured to generate said half rate clock signal in further response to a data input signal.

16. The method according to claim 15, wherein step (C) further comprises the steps of:
   generating a data output signal operating at said half rate clock;
   generating a second data output signal operating at said full rate clock; and
   generates a recovered clock signal.

* * * * *